United States Patent [19]

Hadimioglu et al.

[11] Patent Number: 5,278,028
[45] Date of Patent: Jan. 11, 1994

[54] PROCESS FOR FABRICATING MULTI-DISCRETE-PHASE FRESNEL LENSES

[75] Inventors: Babur B. Hadimioglu, Mountain View; Rene A. Lujan, Sunnyvale, both of Calif.

[73] Assignee: Xerox Corporation, Stamford, Conn.

[21] Appl. No.: 796,742

[22] Filed: Nov. 25, 1991

Related U.S. Application Data

[63] Continuation-in-part of Ser. No. 456,908, Dec. 26, 1989, abandoned.

[51] Int. Cl.$^5$ ............................ G03C 5/00; G03F 7/00
[52] U.S. Cl. ...................................... 430/321; 430/323; 359/565; 359/571; 156/659.1; 156/657
[58] Field of Search ....................... 430/320, 321, 323; 156/659.1, 643, 657; 359/565, 571, 575, 742

[56] References Cited

U.S. PATENT DOCUMENTS

| | | | |
|---|---|---|---|
| 3,576,630 | 4/1971 | Yanagawa | 430/323 |
| 4,172,004 | 10/1979 | Alcorn et al. | 156/659.1 |
| 4,401,367 | 8/1983 | Grantham et al. | 430/4 |
| 4,530,736 | 7/1985 | Mutter | 359/742 |
| 4,895,790 | 1/1990 | Swanson et al. | 430/323 |
| 4,944,838 | 7/1990 | Koch et al. | 156/659.1 |
| 4,966,447 | 10/1990 | Huang et al. | 430/321 |
| 5,041,849 | 8/1991 | Quate et al. | 346/140 |
| 5,058,977 | 10/1991 | Sorin | 359/569 |
| 5,073,007 | 12/1991 | Kedmi et al. | 359/565 |
| 5,156,943 | 10/1992 | Whitney | 430/323 |

FOREIGN PATENT DOCUMENTS 62-265601 11/1987 Japan ..................... 359/742

OTHER PUBLICATIONS

Yamada, K.; Shimizu, H. *New Types of Ultrasound Focusing Transducer Systems.* Japanese Journal of Applied Physics. 1982; vol. 21 Supplement 21-3, pp. 135-137.

Yamada, K.; Sugiyama, T.; Shimizu, H. *Theoretical Considerations on Acoustic Field Formed by Fresnel-Zone-Type Focusing Radiator.* pp. 180-182.

Yamada, K.; Shimizu, H.; Minakata, M. *Planar-Structure Focusing Lens for Operation at 200 MHz and its Application to the Reflection-Mode Acoustic Microscope.* IEEE Ulstrasonics Symposium. 1986; pp. 745-748.

Primary Examiner—Charles L. Bowers, Jr.
Assistant Examiner—Martin J. Angebranndt

[57] ABSTRACT

A process is provided for fabricating multi-discrete-phase binary Fresnel acoustic and optical lenses through the use of standard microelectronic fabrication techniques, thereby enabling such lenses to be produced repeatedly and economically to exacting design specifications.

8 Claims, 3 Drawing Sheets

PROCESS FOR FABRICATING MULTI-DISCRETE-PHASE FRESNEL LENSES

This is a continuation-in-part of application Ser. No. 07/456,908, filed Dec. 26, 1989, now abandoned.

FIELD OF THE INVENTION

This invention relates to multi-discrete-phase Fresnel lenses and, more particularly, to an improved process for fabricating them.

CROSS-REFERENCE TO RELATED APPLICATION

A concurrently filed, commonly assigned United States patent application of Calvin Quate et al. on "Multi-Discrete-Phase Fresnel Acoustic Lenses and Their Application to Acoustic Ink Printing" (now U.S. Pat. No. 5,041,849, granted Aug. 20, 1991), pertains to acoustic focusing lenses which are manufactured in accordance with this invention, including systems embodying such lenses for acoustic ink printing.

BACKGROUND OF THE INVENTION

Multi-discrete-phase Fresnel elements have been proposed for optical applications. See Swanson et al., "Infrared Applications of Diffractive Optical Elements," *Holographic Optics: Design and Applications, SPIE* Vol. 883, 1988, pp 155–162. However, there still is a need for an economical and reliable process for manufacturing optical and acoustical lenses of that type in compliance with relatively exacting design specifications.

SUMMARY OF THE INVENTION

In response to the foregoing and other needs, this invention provides a process for fabricating multi-discrete-phase binary Fresnel lenses through the use of standard large area semiconductor integrated circuit fabrication techniques. To that end, in keeping with this invention, the phase profiles of multi-discrete-phase binary Fresnel lenses are defined by photolithographically patterning a layer of etchable material which is grown or otherwise deposited on an etch resistant substrate.

BRIEF DESCRIPTION OF THE DRAWINGS

Additional features and advantages of this invention will become apparent when the following detailed description is read in conjuction with the attached drawings, in which.

DETAILED DESCRIPTION OF THE ILLUSTRATED EMBODIMENTS

While the invention is described in some detail hereinbelow with specific reference to a certain embodiments, it is to be understood that there is no intent to limit it to those embodiments. On the contrary, the aim is to cover all modifications, alternatives and equivalents falling within the spirit and scope of the invention as defined by the appended claims.

Figure 1:
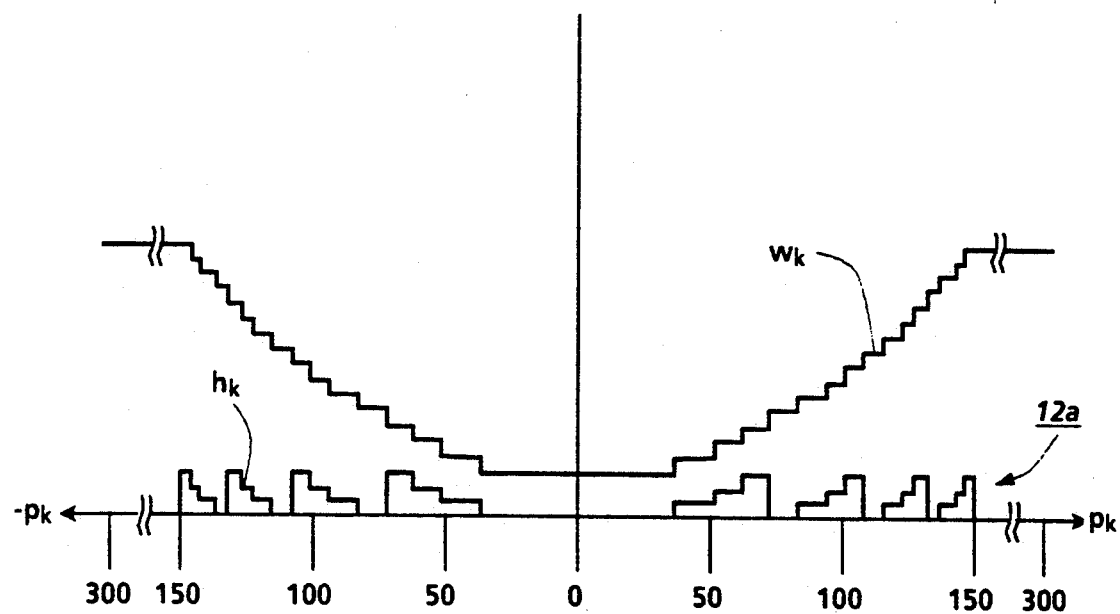
FIG. 1 illustrates the radial profile of a typical multi-discrete-phase Fresnel lens.

Turning now to the drawings, and at this point especially to FIG. 1, it will be seen that there is a multi-discrete phase Fresnel lens 12a with a quantized phase profile which approximates the continuous phase profile of a theoretically ideal, 100% efficient, spherical lens. The lens 12a happens to be an acoustic focusing lens which is designed to simulate a plano-convex refractive lens, but it will be evident that the present invention applies to the fabrication of optic and acoustic multi-discrete phase Fresnel lens of various descriptions. Furthermore, it will be understood that the focusing efficiency of the lens 12a and the width of its narrowest feature (i.e., its outermost phase step as shown) are dependent upon the number, n, of discrete phase levels to which its phase profile is quantized. Specifically, as described in the above-identified Swanson et al article, two phase, four phase, eight phase and sixteen phase embodiments are approximately 41%, 81%, 95% and 99% efficient, respectively, for diffracting axial incident radiation into a focused +1 diffraction order. The remainder of the incident energy is diffracted into the higher positive diffraction orders and into the negative diffraction orders, but virtually none of it is diffracted into the zeroth order.

The lens 12a is illustrated as having four discrete phase levels because a four phase embodiment can be manufactured straightforwardly in accordance with the present invention through the use of currently available semiconductor integrated circuit photolithographic fabrication techniques that involve as few as two masking steps. More particularly, as illustrated, the lens 12a is an acoustic focusing lens which is formed by patterning an $\alpha$-Si layer 23 having a longitudinal sound velocity of approximately 8600 m/sec. to bring axially incident, plane wave acoustic radiation having a nominal frequency of 167 MHz to focus in a +1 diffraction order at a focal distance of 300 $\mu$m through an intermediate liquid layer having a longitudinal sound velocity of 1500 m/sec. Moreover, the lens 12a is designed to have f/number of f/1. In view of those design parameters, the radial phase profile of the lens 12a and the approximate relative phase advance, $w_k$, associated with each of its phase steps are as set forth below (all dimensions are expressed in microns):

| $k_k$ | $\rho_k$ | $h_k$ | $w_k$ |
|---|---|---|---|
| 0 | 0 | 0 | 8.982 |
| 1 | 36.774 | 2.72 | 11.228 |
| 2 | 52.104 | 5.439 | 13.473 |
| 3 | 63.932 | 8.159 | 15.719 |
| 4 | 73.959 | 0 | 17.964 |
| 5 | 82.841 | 2.72 | 20.21 |
| 6 | 90.914 | 5.439 | 22.455 |
| 7 | 98.378 | 8.159 | 24.701 |
| 8 | 105.362 | 0 | 26.946 |
| 9 | 111.956 | 2.72 | 29.192 |
| 10 | 118.226 | 5.439 | 31.437 |
| 11 | 124.219 | 8.159 | 33.683 |
| 12 | 129.976 | 0 | 35.928 |
| 13 | 135.525 | 2.72 | 38.174 |
| 14 | 140.892 | 5.439 | 40.419 |
| 15 | 146.096 | 8.159 | 42.665 |
| 16 | 151.155 | 0 | 44.91 | where $k_k$ is a dimensionless phase step index; $\rho_k$ is the radial distance from the center of the aperture of the lens 12a to its $k^{th}$ phase transition; and $h_k$ is the height of the $k^{th}$ phase step of the lens 12a relative to the surface of the underlying substrate 22. As will be seen, there are sixteen $\pi/2$ radian phase transitions (index numbers 0–16) within the aperture of the lens 12a, which are spatially sequenced to define four complete $2\pi$ radian phase cycles. The relative phase change of the $+1$ diffraction order that is caused by these phase transitions is expressed as a relative "phase advance," $w_k$, because the acoustic velocity of the wavefront of the radiation decreases as it propagates from the lens 12a into the liquid layer (not shown). For that reason, the lens 12a is designed so that its "phase delay" for the $+1$ diffraction order decreases radially of its aperture as a function of approximately the square of the radial distance, $\rho_k$, thereby causing the lens 12a to simulate a planoconcave refractive lens.

In accordance with this invention, the lens 12a is fabricated by employing conventional photolithography for patterning a layer 23 of etchable material which is grown or otherwise deposited on an essentially flat face of an etch resistant substrate 22. The lens 12a is axially illuminated by plane wave radiation from the rear, so the substrate 22 and the etchable layer 23 are composed of materials which are sufficiently transparent to that radiation. For example, in the acoustic case, the substrate 22 suitably is composed of quartz or glass, while the etchable layer 22 typically is composed of a-Si. It is to be noted that the narrowest feature of the representative four phase lens 12a is about 5 $\mu$m wide (see index No. 15 of the foregoing table), which clearly is well within the resolution limits of standard large area microelectronic photolithographic patterning processes. Indeed, it can be shown that the narrowest feature of a corresponding eight phase lens has a width of approximately 2.5 $\mu$m, which also is consistent with the capabilities of modern photolithography.

If the thickness of the etchable layer 23 can be controlled with sufficient precision while it is being deposited on the substrate 22 to provide an essentially flat layer 23 of a-Si or similar material having a thickness essentially equal to the height of the highest phase steps of the lens 12a (i.e., a thickness of $2\pi(n-1)/n$ radians), no further pre-etch processing is required. It sometimes may be easier, however, to first grow a somewhat thicker layer of etchable material on the substrate 22 and to thereafter polish the etchable material down the desired thickness and flatness of the layer 23.

Figure 2:
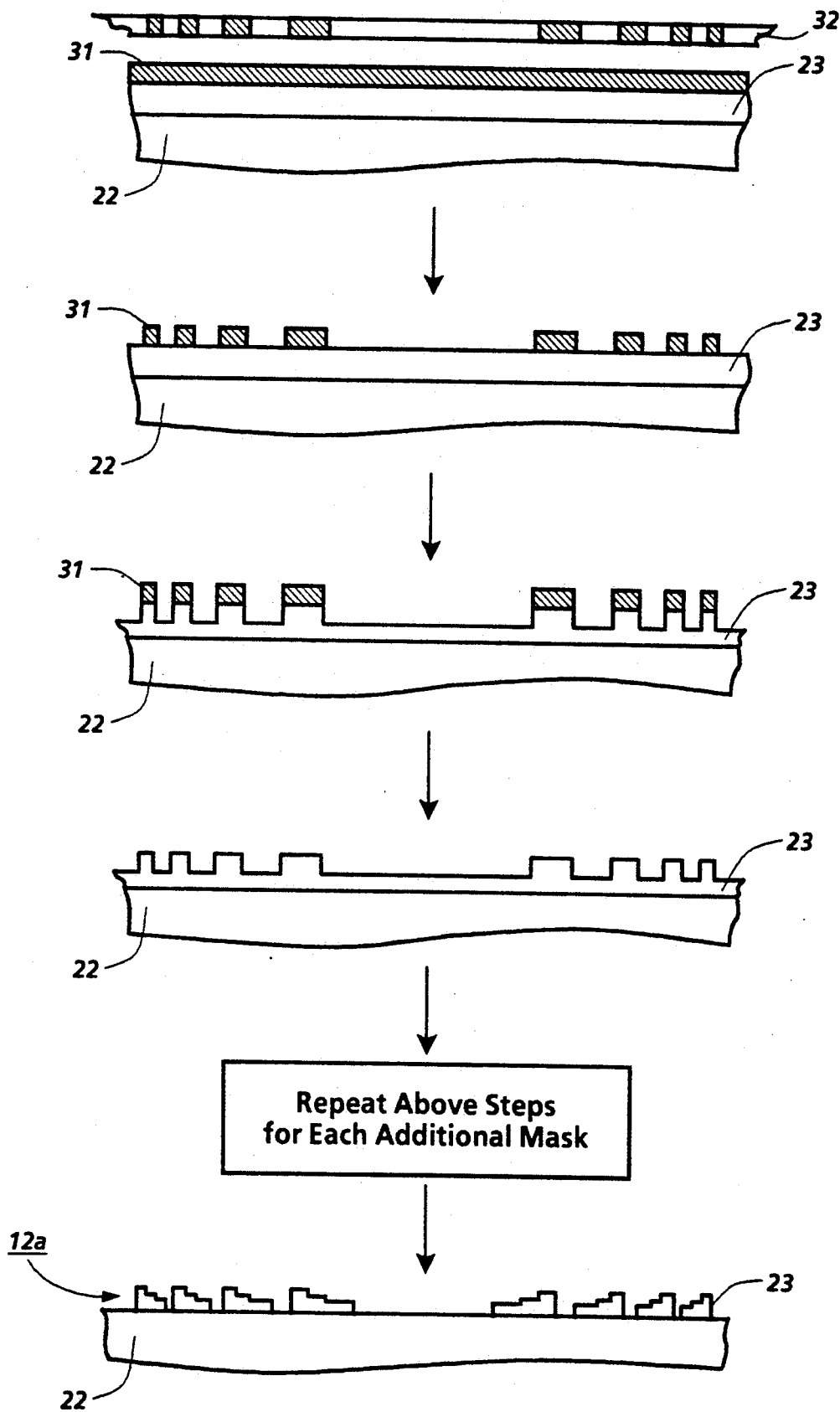
FIG. 2 illustrates a basic process for fabricating such multi-discrete-phase Fresnel lenses in accordance with this invention.

Referring to FIG. 2, it will be seen that one or more photolithographic etch steps are employed for etching the phase profile of the lens 12a into the layer 23. As few as N binary weighted amplitude masks are sufficient for defining the phase profiles for Fresnel lenses 12a–12i having n discrete phase levels, where n=a modulo-2 integer and $2^N = n$. The individual masks of a multimask mask set may be etched into the layer 23 in any desired order, but the depths to which the masks of a binary weighted mask set are etched into it varies from mask-to-mask in dependence upon their respective binary weights. Specifically, if a counting number index value, i, is employed for sequentially numbering the masks of a binary weighted mask set in order from the most heavily weighted to the least heavily weighted mask, the etch depth, $d_i$, for mask number i is given by:

$$d_i = 2^{(1-i)} \cdot \pi \text{ radians}$$

where $i = 1, 2, \ldots, N$.

Of course, whenever a plurality of masks are employed, a mask aligner (not shown) should be used to register the successive mask patterns with the appropriate precision For imparting the desired phase profile to the lens through the use of standard photolithography, the etchable layer 23 is overcoated with a conventional uv-sensitive photoresist 31 which then is exposed to uv radiation in accordance with the pattern of a first binary amplitude mask 32. Thereafter, the exposed photoresist 31 typically is removed from the layer 23, such as by a wet etch washing. An anisotropic etch, such as a reactive ion etch, then is employed for removing material from the exposed regions of the layer 23 (i.e., the regions not overcoated with the unexposed photoresist 31) to a depth dependent upon the binary weight of the mask 32. An anisotropic etch is preferred because it creates phase steps having essentially vertical sidewalls, thereby producing sharp phase transitions between neighboring phase steps.

After the pattern of the first mask 32 has been etched into the layer 23, the residual photoresist 31 is removed. The foregoing process then can be repeated as often as is required for etching one after another of any additional mask patterns into the layer 23. As previously pointed out, the etch depth for a multi-mask set of binary weighted amplitude masks varies from mask-to-mask. However, the cumulative depth of all of the etches is:

$$\sum_{i=1}^{N} 2^{n/2} \exp . i = 2\pi(n-1)/n \text{ radians}$$

so the etch resistant substrate 22 is an effective etch-stop for the final etch.

Figure 3:
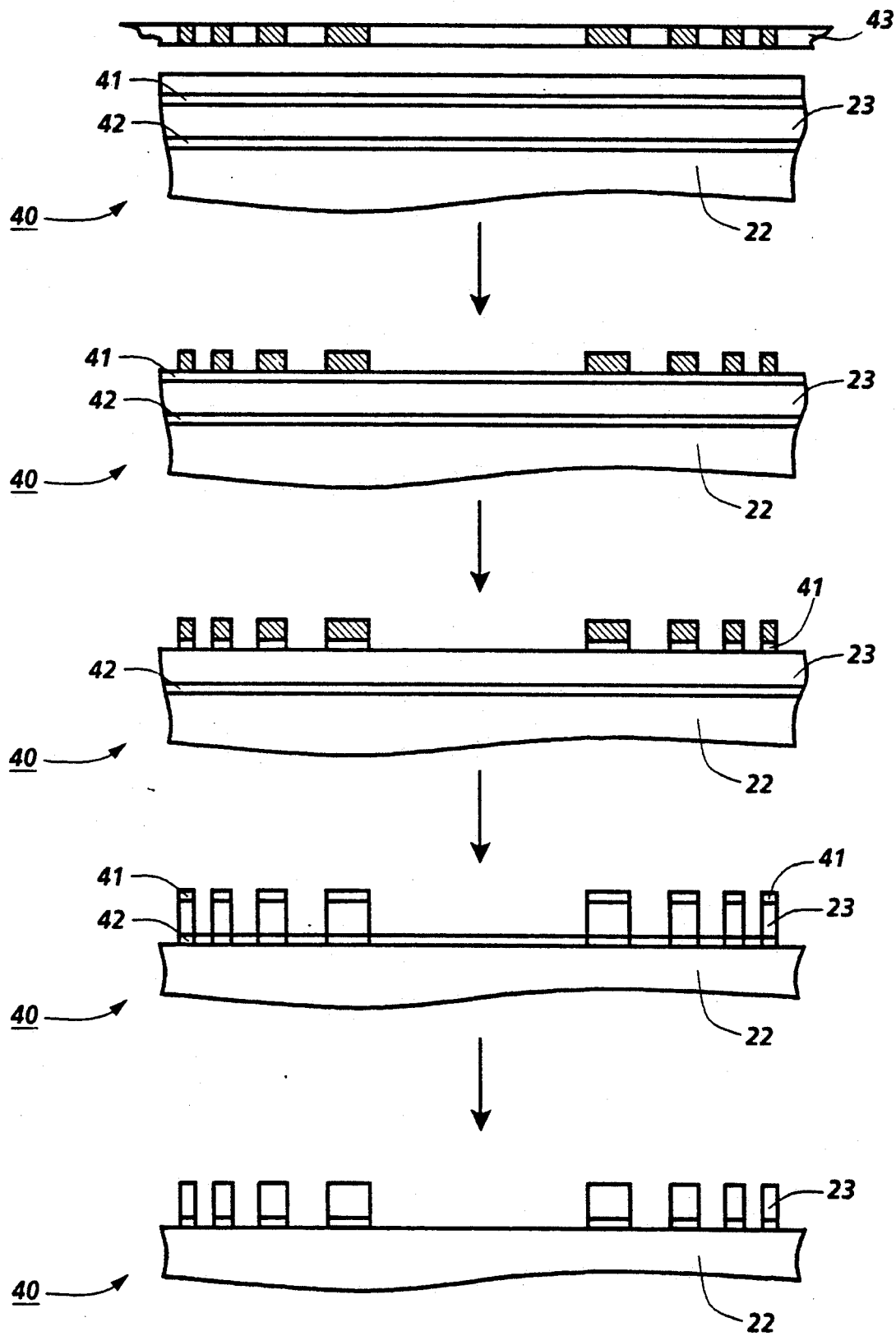
FIG. 3 illustrates the an improved process for fabricating such lenses in accordance with a preferred embodiment of this invention.

As shown in FIG. 3, modest but significant improvements can be made to the lens fabrication process of this invention to even more fully protect the quantized phase steps of a lens 40 from being attacked during the anisotropic etching of its a-Si layer 23. Like reference numerals have been used in FIGS. 2 and 3 for identifying like parts, so the following discussion concentrates primarily on the process improvements.

For more fully protecting the heights of the quantized phase steps of the two phase lens 42 from the anisotropic reactive ion etching of the a-Si layer 23, the a-Si layer 23 and the quartz or glass substrate 22 of the unpatterned multilayer lens body are overcoated with thin (e.g., approximately 0.1 microns thick) layers of material 41 and 42, respectively, that are essentially insensitive to reactive ion etching. Aluminum (Al) and chromium (Cr) are materials that fall into this category, and either of them may be used for the protective overcoating 41 that is deposited on the a-Si layer 23. However, the protective overcoating 42 for the substrate 22 is Cr because Cr not only is virtually insensitive to reactive ion etching, but also is known to improve the bonding of a-Si to quartz and glass.

Some additional steps are performed during the fabrication of the lens 40 because of the use of the protective overcoatings 41 and 42. As before, a binary amplitude pattern is photolithographically etched into the body of the lens 40 by a series of more or less conventional semiconductor processing steps. To that end, a uv-sensitive photoresist overcoat layer 31 first is patterned in accordance with the radial phase profile of a binary amplitude mask 43, substantially as previously described. Next, a suitable wet etch is employed for removing the exposed portions of the protective overcoat layer 41, thereby patterning the overcoat 41 in accordance with the phase profile of the mask 43. A reactive ion etch then is employed for transferring the phase profile of the mask 42 to the α-Si layer 23, so it is to be noted that the phase steps of the lens 42 are immune from attack by this reactive ion etch. Specifically, the patterned overcoat 41 and the unpatterned overcoat 42 function as positive etch stops for preventing the reactive ion etch from attacking the phase steps that are being formed in the α-Si layer 23 and the phase steps that have been previously defined (such as by the surface of the substrate 22), respectively. The reactive ion etch usually attacks the patterned photoresist 31, but if any residual photoresist 31 remains, it may be removed through the use of an ordinary photoresist removal process (not shown). Finally, another wet etch is employed for patterning the exposed portions of the overcoating 42 in accordance with the radial phase profile of the mask 43, thereby imparting the desired binary amplitude pattern to the lens 40 with very substantial precision.

While the improved lens fabrication process of FIG. 3 has been described with reference to the fabrication of a two phase lens 42, it will be understood that it can be extended for use in fabricating lenses having a greater number of phase steps. The key, of course, is to ensure that all of the phase steps of the lens are protected by reactive ion etch insensitive overcoatings (e.g., Al or Cr) during the reactive ion etching of the α-Si layer 23, thereby precluding that etch from affecting the height of any of the phase steps.

CONCLUSION

While the present invention has been described as applied to the fabrication of a single lens, it will be understood that it is well suited for use in fabricating one and two dimensional arrays of lenses, including for applications requiring precise center-to-center spacing of the lenses within such an array. Indeed, the precision with which multi-discrete-phase Fresnel lenses can be fabricated in accordance with this invention is limited only by the precision of the state of the art photolithographic semiconductor integrated circuit fabrication technology and, therefore, is likely to increase with future improvements in the precision of such photolithography. The application of the present invention to the fabrication of acoustic focusing lenses has been emphasized, but it will be apparent that the present invention may be employed for fabricating optical lenses and other types of acoustical lenses.

What is claimed is:

1. A method for fabricating a multi-discrete-phase Fresnel lens having a predetermined radial phase profile that is composed of a plurality of discrete phase steps, said method comprising the steps of depositing a first reactive ion etch resistant overcoat of predetermined thickness on an essentially flat surface of a substrate;

depositing a layer of etchable material of predetermined thickness on said first overcoat;

depositing a second reactive ion etch resistant overcoat on said etchable material;

photolithographically patterning said second overcoat in conformity with said radial phase profile for selectively exposing radially bounded portions of said etchable material;

reactive ion etching the exposed portions of said etchable material to expose underlying portions of said first overcoat, removing the exposed portions of said first overcoat and the patterned second overcoat for profiling said lens in accordance with at least a first and a second of said phase steps.

2. The method of claim 1 wherein
said etchable material is a silicon material.

3. The method of claim 1 wherein
said etchable material is amorphous silicon, and said first overcoat produces increased adhesion between said amorphous silicon and said substrate.

4. The method of claim 3 wherein
said first overcoat and said amorphous silicon layer are deposited to a combined thickness that determines a maximum amplitude phase step for said lens.

5. The method of claim 3 wherein
said first overcoat and said amorphous silicon layer are deposited to a combined thickness that exceeds a maximum amplitude phase step for said lens, and
said method further includes the step of grinding said amorphous silicon layer back until said combined thickness essentially equals said maximum amplitude phase step.

6. The method of claim 3 wherein
said first overcoat and said silicon material are deposited to a combined thickness that determines a maximum amplitude phase step for said lens.

7. The method of claim 3 wherein
said first overcoat and said silicon material are deposited to a combined thickness that exceeds a maximum amplitude phase step for said lens, and
said method further includes the step of grinding said silicon material back until said combined thickness essentially equals said maximum amplitude phase step.

8. The method of any one of claims 1–7 or wherein
said lens has n discrete phase steps and has a frequency response which is optimized at a predetermined frequency, and
a predetermined number, N, of binary weighted amplitude masks are etched into said lens, sequentially and in registered alignment if N is greater than 1, to an etch depth, $d_i$, which varies from mask-to-mask in accordance with an index value i which incrementally increases from the most heavily weighted to the least heavily weighted of said masks, such that the etch depth for each mask is given for said predetermined frequency by:

$$d_i = 2^{(1-i)} \cdot \pi \text{ radians}$$

where $i = 1, 2, \ldots, N$.

* * * * *